(12) United States Patent
Blish, II et al.

(10) Patent No.: US 6,518,661 B1
(45) Date of Patent: Feb. 11, 2003

(54) APPARATUS FOR METAL STACK THERMAL MANAGEMENT IN SEMICONDUCTOR DEVICES

(75) Inventors: Richard C. Blish, II, Saratoga, CA (US); Glen Gilfeather, Del Valle, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 09/826,576

(22) Filed: Apr. 5, 2001

(51) Int. Cl.$^7$ .............................................. H01L 23/367
(52) U.S. Cl. ....................... 257/712; 257/758; 257/713; 257/700; 257/706; 257/719; 257/737; 257/759; 257/774; 361/688; 361/695; 361/696; 361/697; 361/701; 361/702; 361/704; 361/712; 361/717; 361/718; 361/719; 361/720
(58) Field of Search ................................ 257/678, 684, 257/700–702, 706, 709, 712, 713, 717, 720, 722, 737, 738, 778, 775, 748, 759, 762, 920, 758, 774; 361/768, 774, 783, 687, 695–697, 702, 703, 709, 712, 718–720; 174/255, 257, 264; 438/106, 121, 108, 122

(56) References Cited

U.S. PATENT DOCUMENTS

| 5,621,616 A | * | 4/1997 | Owens et al. ................ 257/713 |
| 6,330,154 B1 | * | 12/2001 | Fryers et al. ................ 361/695 |
| 6,333,557 B1 | * | 12/2001 | Sullivan ..................... 257/758 |

* cited by examiner

*Primary Examiner*—Tom Thomas
*Assistant Examiner*—Patricia M. Costanzo

(57) ABSTRACT

A semiconductor apparatus includes a semiconductor body in the form of a silicon substrate havng a plurality of active devices. A metal stack including a plurality of metal layers is operatively associated with the active devices. A plurality of conductive elements are connected to the metal stack and to a substrate in the form of for example a printed circuit board. Vias connect conductive elements with respective portions of at least some of the metal layers, with the conductive elements connected to heat absorbing members within the substrate, which is in turn connected to a heat sink external to the substrate, the vias being spaced at regular intervals so as to promote heat dissipation from the metal stack therethrough to the heat absoring members and the heat sink.

14 Claims, 1 Drawing Sheet

APPARATUS FOR METAL STACK THERMAL MANAGEMENT IN SEMICONDUCTOR DEVICES

BACKGROUND OF THE INVENTION

1. Field of the Invention

This invention relates generally to semiconductor devices, and more particularly, to apparatus for providing heat dissipation for such devices.

2. Discussion of the Related Art

FIG. 1 shows a typical prior art semiconductor structure 10 which will be described as background to the present invention. The semiconductor structure 10 includes a semiconductor body 12 in the form of a silicon substrate including a plurality of active devices such as transistors 14, each in turn including a source and drain and a gate. A plurality of conductive metal layers 16 in the form of a metal stack 17 are housed in a dielectric material 18 (such as silicon dioxide) on the semiconductor body 12, and the metal layers 16 are operatively connected to the active devices 14 and to each other by means of vias 20, all as is well-known. The metal layers 16 are also connected to conductive elements 22 in the form of solder bumps, by means of vias 24. The conductive elements 22 connect to a substrate 26, for example, a printed circuit board.

The operation of the active devices 14 causes heat generation and buildup in the semiconductor body 12. To dissipate heat from the semiconductor body 12, thermal grease (or thermally conducive elastomer) 28 is applied to the body 12 on the side thereof opposite the metal stack 17, and a heat sink 30 is mounted on the thermal grease 28. Heat in the semiconductor body 12 is transferred through the thermal grease 28 to the heat sink 30 and is removed from the sink 30 by operation of a fan 32, thereby avoiding heat buildup in the semiconductor body 12.

Modem semiconductor devices of this type include a number of metal layers, currently for example as many as seven, with this number expected to increase in the future. Heat buildup caused by current in a metal stack 17 with many layers has become a problem. Ironically, the problem is exacerbated by the industry movement to the use of copper metal layers, rather than aluminum, which permits a several fold increase in current density (to improve electrical performance and device density) without increasing electromigration problems, yet resistance of such copper conductors is only about ½ that of aluminum, so that heat generated in the stack 17 is significantly increased. The Joule heating effect is particularly great, as it varies as the square of the current, but is linear with resistance. Also, low dielectric constant materials in which the stack is housed are now supplanting silicon dioxide, and these low dielectric constant materials have considerably less thermal conductivity than silicon dioxide, which is already poor in this regard Thus, heat generated in the metal stack tends to be held in the region thereof, rather than dissipated therefrom.

While the heat sink 30 and fan 32 described above are effective in removing heat from the semiconductor body 12, such heat sink 30 is physically too far away (in the sense of thermal resistance) from the metal stack 17 to effectively dissipate heat from the stack 17. As a result, heat generated in the metal stack 17 is dissipated to a limited extent through the conducting elements 22 into the substrate 26, which has proven to be an inefficient heat dissipation system Therefore, what is needed is a heat dissipation system which is effective for dissipating heat from the metal stack of a semiconductor structure, which system is also simple in design and manufacture.

SUMMARY OF THE INVENTION

The present invention is a semiconductor apparatus including a semiconductor body in the form of a silicon substrate having a plurality of active devices. A metal stack including a plurality of metal layers is operatively associated with the active devices. Portions of at least some of the metal layers are connected by vias which are in turn connected to a conductive elements in the form of a solder bumps, in turn connected to a substrate in the form of a printed circuit board Heat generated in the metal stack is dissipated through the vias, through the conductive elements, and to a heat absorbing member within the substrate, and to an additional heat sink outside the substrate, connected to the heat absorbing member within the substrate by another via. The vias are positioned at regular intervals relative to the metal stack so as to promote effective heat removal from the metal stack.

The present invention is better understood upon consideration of the detailed description below, in conjunction with the accompanying drawings. As will become readily apparent to those skilled in the art from the following description, there is shown and described an embodiment of this Invention simply by way of the illustration of the best mode to carry out the invention As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventors for practicing the invention.

Figure 1:
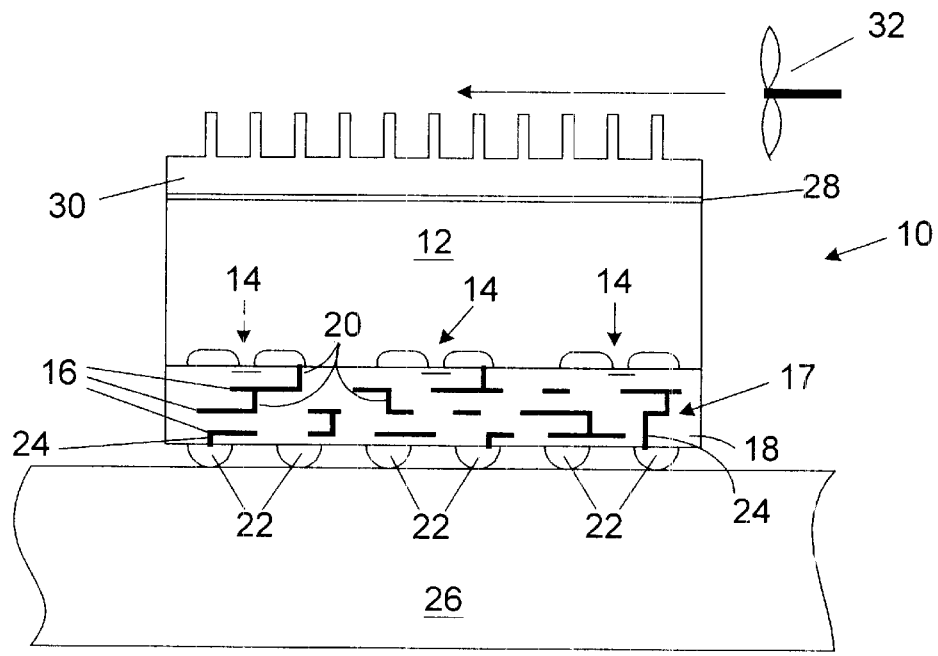
FIG. 1 is a sectional view of a prior art semiconductor apparatus.
Figure 2:
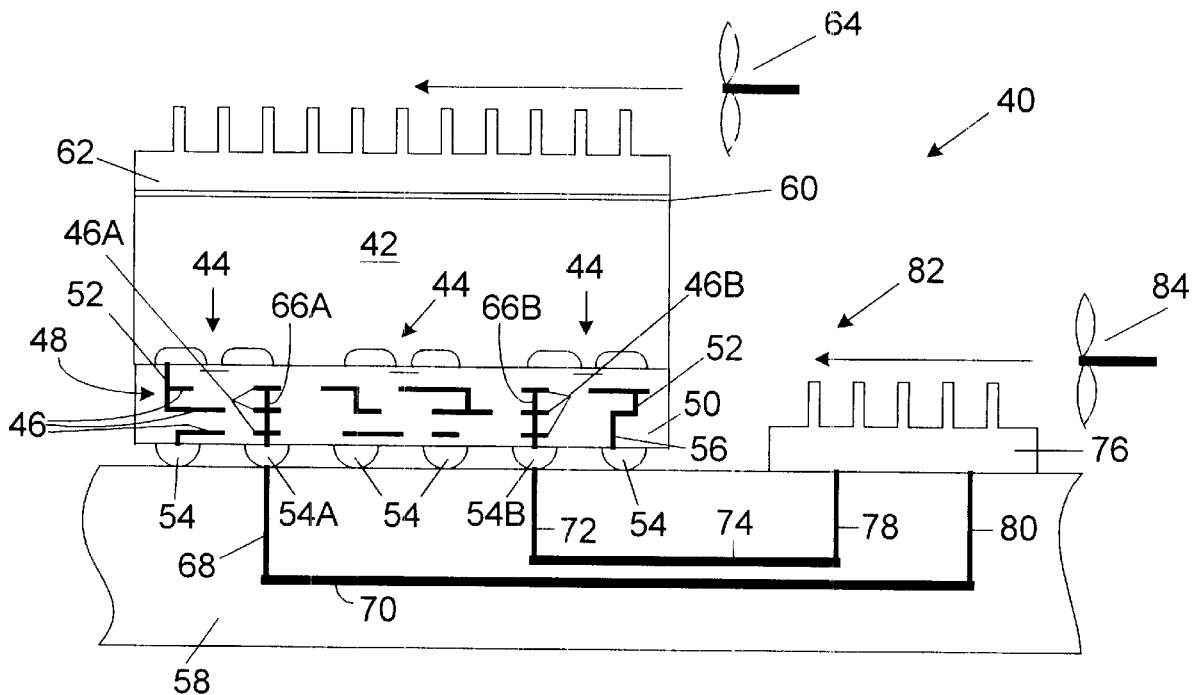
FIG. 2 is a sectional view similar to that shown in FIG. 1, but illustrating the present invention.

FIG. 2 illustrates an embodiment of the present invention. As shown therein, the present semiconductor structure 40 includes a semiconductor body 42 in the form of the silicon substrate having a plurality of active devices 44 such as transistors associated therewith, each in turn including a source and drain and a gate. A plurality of conductive metal layers 46, for example cooper, in the form of a metal stack 48, are housed in a dielectric material 50 (such as low k dielectric material) on the semiconductor body 42. The metal layers 46 are operatively connected to the active devices 44 and to each other by means of vias 52. The metal layers 46 are also connected to conductive elements 54 in the form of solder bumps for operative association therewith, by means of the vias 56. The conductive elements 54 connect to a substrate 58, for example a printed circuit board.

As described above, the operation of the active devices 44 causes heat generation and buildup in the semiconductor body 42. Thermal grease 60 is applied to the body 42 on the side thereof opposite the metal stack 48, and a heat sink 62 is mounted on the thermal grease 60. Heat in the semiconductor body 42 is transferred through the thermal grease 60 to the heat sink 62 and is removed from the sink 62 by operation of a fan 64, thereby avoiding heat buildup in the semiconductor body 42.

As also described above, heat buildup occurs in the metal stack 48 due to current passing through the many layers 46 thereof, and is exacerbated with use of copper metal layers 46 housed in low k dielectric 50.

To deal with the problem of heat buildup in the metal stack 48, spaced-apart vias 66 (two shown at 66A, 66B) are connected to respective conductive elements 54A, 54B of the semiconductor structure 40 and to respective portions 46A, 46B of the metal layers 46. Via spacing or positioning relative to the metal stack 48 is determined by thermal resistance from the most distant traces within the metal stack 48 to the closest such via 66. The conductive element 54A is connected to a via 68 within the substrate 58, which via 68 is in turn connected to heat absorbing member 70 within or internal to the substrate 58 (which heat absorbing member 70 may also, for example, receive power, ground or clock signals). The conductive element 54B is connected to a via 72 within the substrate 58, which via 72 is in turn connected to another heat absorbing member 74 within or internal to the substrate 58 (again, which heat absorbing member 74 may also receive power, ground or clock signals). The heat absorbing members 70, 74 are connected to another heat sink 76 external to the substrate 58, by means of respective vias 78, 80 within the substrate 58, the external heat sink 76 being electrically insulated from the rest of the structure.

The heat absorbing members 70, 74 and heat sink 76 comprise a heat sink structure 82 operatively connected to the substrate 58. As heat is generated in the metal stack 48, it is dissipated by being transferred from the metal stack 48 into the portions 46A of the metal layers 46, through the vias 66A, 66B and conductive elements 54A, 54B, through the vias 68, 72 and into the internal heat absorbing members 70, 74. A portion of the heat buildup in the metal stack 48 is so removed to the heat absorbing members 70, 74. Additionally, heat is transferred from the heat absorbing members 70, 74 through the vias 78, 80 to the external heat sink 76 and is dissipated there from by operation of fan 84. (While fan type heat sinks are shown and described in this embodiment, it will be understood that various other types of heat sinks, for example, spray cool, thermoelectric, Peltier, water, or the like, can be used as well).

It will be understood that FIG. 2 shows only a portion of a semiconductor structure 40.

The connection of portions 46A, 46B of metal layers 46 to conductive elements 54A, 54B by means of vias 66A, 66B, which conductive elements 54A, 54B are in turn connected to internal and external heat absorbing members as described above, can with advantage be repeated at regular intervals along the metal stack 48 for efficient, substantially uniform heat dissipation from the metal stack 48. As set forth above, the periodicity of the vias 66 relative to the metal stack 48 is determined by thermal resistance from the most distant traces within the metal stack 48 to the closest such via 66, so as to provide effective heat transfer from the metal stack 48 to the heat absorbing structure 82.

The apparatus described is effective for dissipating heat from a metal stack with copper conductive layers housed in a low k dielectric. The apparatus is simple in design and operates efficiently so as to avoid problems of heat buildup in such a structure.

The foregoing description of the embodiment of the invention has been presented for purposes of illustration and description. It is not intended to be exhaustive or to limit the invention to the precise form disclosed. Other modifications or variations are possible light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A semiconductor apparatus comprising:

a semiconductor body having a plurality of active devices;

a plurality of conductive layers in operative association with the active devices of the semiconductor body;

a plurality of conductive elements in operative association with the conductive layers;

a substrate connected to the plurality of conductive elements;

a plurality of vias connecting portions of first and second conductive layers and at least one conductive element; and a heat absorbing structure operatively connected to the substrate and connected to the conductive element which is connected to the portions of the first and second conductive layers by the via;

the vias being positioned at intervals relative to the plurality of conductive layers so as to provide effective heat transfer from the plurality of conductive layers to the heat absorbing structure;

wherein the substrate comprises a printed circuit board, and wherein the heat absorbing structure comprises a heat absorbing member which is the internal of the substrate.

2. The semiconductor apparatus of claim 1 wherein the vias are positioned at substantially regular intervals relative to the plurality of conductive layers.

3. The semiconductor apparatus of claim 1 wherein the vias connect portions of first and second conductive layers with respective conductive elements of the plurality of conductive elements.

4. A semiconductor apparatus comprising:

a semiconductor body having a plurality of active devices;

a plurality of conductive layers in operative association with the active devices of the semiconductor body;

a plurality of conductive elements in operative association with the conductive layers;

a substrate connected to the plurality of conductive elements;

a plurality of vias connecting portions of first and second conductive layers and at least one conductive element; and a heat absorbing structure operatively connected to the substrate and connected to the conductive element which is connected to the portions of the first and second conductive layers by the via;

the vias being positioned at intervals relative to the plurality of conductive layers so as to provide effective heat transfer from the plurality of conductive layers to the heat absorbing structure;

wherein the substrate comprises a printed circuit board, and wherein the heat absorbing structure comprises a plurality of heat absorbing members which are internal of the substrate.

5. A semiconductor apparatus comprising:

a semiconductor body having a plurality of active devices;

a plurality of conductive layers in operative association with the active devices of the semiconductor body;

a plurality of conductive elements in operative association with the conductive layers;

a substrate connected to the plurality of conductive elements;

a plurality of vias connecting portions of first and second conductive layers and at least one conductive element; and a heat absorbing structure operatively connected to the substrate and connected to the conductive element which is connected to the portions of the first and second conductive layers by the via;

the vias being positioned at intervals relative to the plurality of conductive layers so as to provide effective heat transfer from the plurality of conductive layers to the heat absorbing structure;

wherein the substrate comprises a printed circuit board, and wherein the heat absorbing structure comprises a heat sink which is external to and mounted on the substrate.

6. The apparatus of claim 5 wherein the heat absorbing structure comprises a fan-type heat sink.

7. A semiconductor apparatus comprising:

a semiconductor body having a plurality of active devices;

a plurality of conductive layers in operative association with the active devices of the semiconductor body;

a plurality of conductive elements in operative association with the conductive layers;

a substrate connected to the plurality of conductive elements;

a plurality of vias connecting portions of first and second conductive layers and at least one conductive element; and a heat absorbing structure operatively connected to the substrate and connected to the conductive element which is connected to the portions of the first and second conductive layers by the via;

the vias being positioned at intervals relative to the plurality of conductive layers so as to provide effective heat transfer from the plurality of conductive layers to the heat absorbing structure;

wherein the substrate comprises a printed circuit board, and wherein heat absorbing structure comprises a heat absorbing member which is internal of the substrate, and a heat sink which is external to and mounted on the substrate.

8. The apparatus of claim 7 and further comprising an additional via in the substrate and connecting the heat absorbing member and heat sink.

9. The apparatus of claim 1 wherein the semiconductor body is a silicon body.

10. The apparatus of claim 1 and further comprising an additional heat sink, in operative association with the semiconductor body.

11. The apparatus of claim 1 wherein the plurality of conductive layers is a plurality of metal layers.

12. The apparatus of claim 11 wherein the plurality of metal layers is a plurality of copper layers.

13. The apparatus of claim 1 and further comprsing a low k dielectric in which the conductive layers are housed.

14. The apparatus of claim 13 wherein the plurality of conductive layers is a plurality of copper layers.

* * * * *